United States Patent
Jürgensen et al.

(12) 
(10) Patent No.: US 6,279,506 B1
(45) Date of Patent: Aug. 28, 2001

(54) REACTOR FOR COATING PLANE SUBSTRATES AND METHOD FOR PRODUCING SAID SUBSTRATES

(75) Inventors: Holger Jürgensen, Aachen; Karl Heinz Bachem, Kirchzarten, both of (DE)

(73) Assignee: Aixtron AG (DE)

( * ) Notice: Subject to any disclaimer, the term of this patent is extended or adjusted under 35 U.S.C. 154(b) by 0 days.

(21) Appl. No.: 08/888,244

(22) Filed: Jul. 3, 1997

Related U.S. Application Data

(63) Continuation of application No. 08/750,990, filed on Dec. 24, 1996, now abandoned.

(30) Foreign Application Priority Data

Jun. 26, 1995 (WO) .................................. PCT/DE95/00806

(51) Int. Cl.[7] .................................................. C23C 16/00
(52) U.S. Cl. ........................ 118/730; 118/500; 422/186
(58) Field of Search ........................... 118/715, 728, 118/729, 730, 500, 719; 422/186

(56) References Cited

U.S. PATENT DOCUMENTS

| | | | |
|---|---|---|---|
| 5,100,502 | * 3/1992 | Murdoch et al. | 118/728 |
| 5,374,315 | * 12/1994 | DeBoer et al. | 118/725 |
| 5,494,522 | * 2/1996 | Moriya et al. | 118/719 |
| 5,782,979 | * 7/1998 | Kaneno et al. | 118/500 |

FOREIGN PATENT DOCUMENTS

| | | |
|---|---|---|
| 0 448 346 A1 | 9/1991 | (EP) . |
| 2 366 871 | 10/1977 | (FR) . |
| 2-221399 | 8/1990 | (JP) . |

OTHER PUBLICATIONS

2300 Journal of Crystal Growth 107 (1991) Jan. I, Nos. 1/4, Amsterdam, NL, pp. 370–375.

Journal of Electronic Materials, vol. 17, No. 5, 1988 The Inverted Horizontal Reactor: Growth of Uniform InP and GaInAs by LPMOCVD, pp. 381–386; N. Puetz, G. Hillier and A.J. Springthorpe.

* cited by examiner

Primary Examiner—Kathryn Gorgos
Assistant Examiner—Thomas H. Parsons
(74) Attorney, Agent, or Firm—St. Onge Steward Johnston & Reens

(57) ABSTRACT

A reactor for coating flat substrates and particularly wafers is described which has
- a reaction vessel into which reaction gases can be introduced, and
- a substrate holder unit in which substrates are held in a holder such that the main surface of the substrates to be coated is oriented downward during the deposition operation and is aligned essentially in parallel to the flow direction of the reaction gases. The invention is characterized in that at least two spaces for substrates are provided on the substrate holder unit and in that the holder or holders is/are constructed in the manner of a template which has openings for the surfaces of the substrates to be coated.

16 Claims, 2 Drawing Sheets

REACTOR FOR COATING PLANE SUBSTRATES AND METHOD FOR PRODUCING SAID SUBSTRATES

CROSS-REFERENCE TO RELATED APPLICATIONS

This application is a continuation of application Ser. No. 08/750,990, filed Dec. 24, 1996, abandoned.

This application claims the priority of Priority Document P 44 22 202.5, filed in Germany on Jun. 24, 1994 and PCT/DE95/00806, international filing date Jun. 26, 1995, the disclosures of which are expressly incorporated by reference herein.

BACKGROUND OF THE INVENTION

1. Field of the Invention

The invention relates to a reactor for coating flat substrates as well as to a process for manufacturing flat substrates using reactors of the above-mentioned type.

2. Description of the Related Art

Reactors for coating substrates using CVD-processes and particularly MOCVD-processes as well as plasma coating processes require a reaction gas flow through the so-called reactor vessel or reaction vessel in which the substrate(s) to be coated is/are arranged. In order to achieve an excellent coating of the surface of the substrates, it is required to guide the reaction gas flow as uniformly as possible, that is, in a laminar flow so closely past the substrate surface that a layer formation takes place on the substrate which is as homogeneous as possible.

During the manufacturing of "normal" layers, high temperatures are, however, required during the coating process which, among others, have heat convection effects within the gas flow and thus lead to a disturbance of the laminar flow. Although it is possible to increase the laminarity and thus the parallelism of the reaction gas flow relative to the coating surface by means of an increased reaction gas flow rate, transversal flow components may also occur within the reaction vessel caused by convection but also by constructive obstacles which stand in the way of the reaction gas flow. Within the reactor vessel, such transversal flow components lead to the formation of local vortexes which have a negative influence on the coating process.

On the basis of the occurring turbulent flow regions, it can also be explained that the layer formation on the preferably flatly designed substrate does not take place uniformly but that points occur which have a higher layer depositing as well as points which have a lower layer depositing.

In addition, in the case of the known reactor systems, in which the substrates to be coated are arranged on the bottom of the reaction vessel, surface effects occur which are the result of condensate deposits which form on the reactor walls during the coating process and, dependent on the amount of condensate, fall downward from the upper reactor walls and damage the surface of the substrate.

SUMMARY OF THE INVENTION

It is an object of the invention to provide a reactor for coating flat substrates and particularly wafers in the case of which a high flow rate is possible while the layer formation is homogeneous, as well as to provide a process for manufacturing such substrates which permits the manufacturing of the most varied substrates.

According to the invention, this object is achieved by means of further developments indicated in the claims.

The invention is based on a reactor as suggested by Fraunhofer-Gesellschaft zur Förderung der angewandten Forschung e.V.

This reactor suggested by Fraunhofer-Gesellschaft, for whose basic construction no protection is claimed within the scope of the present application, has a reactor vessel or reaction vessel into which the reaction gas as well as optionally a carrier gas can be introduced. At least one substrate is arranged in the reaction vessel such that a main surface of the substrate is aligned essentially in parallel to the flow direction of the reaction gases.

For increasing the flow rate, at least two spaces for substrates are provided on the substrate holder unit. The holder or holders is/are constructed in the form of a template which has openings for the surfaces of the substrates to be coated.

According to the invention, the fact is utilized that convective transversal flows within a reactor vessel during the coating operation can be avoided in that the substrate to be coated is mounted in the area of or on the upper vessel chamber such that the main surface to be coated is oriented downward.

In this manner, vortex formations within the flow canal can be excluded. Likewise, because of the substrate orientation according to the invention, the danger of damage as the result of condensate particles impacting on the substrate surface is virtually excluded.

According to the invention, the rotatably disposed carrying ring holding device which holds the substrate contributes to the fact that the reaction gas flow which may have inhomogeneities within the laminar flow rests as uniformly as possible on the substrate surface. This permits a layer formation on the substrate which, on average, is homogeneous.

In principle, the reactor is constructed such that a reactor housing is provided in which the reactor vessel or reaction vessel is contained in which the coating operation takes place. The reaction gases flow through the reactor vessel within a closed loop and in the process coat the substrate surfaces entered and mounted inside the reactor vessel. The reactor housing, in turn, is connected with a transfer canal housing which has a cassette housing in which the substrates are arranged which are to be coated and which, as required and for reasons of a fully automated coating sequence, store the substrates. A cassette charger is provided, in which the substrate surfaces can be deposited together with their associated carrying rings.

Furthermore, the cassette housing can be connected to a transfer canal housing mounted directly on it. The connection between the transfer canal housing and the cassette housing as well as the cassette housing and the reactor housing takes place by gas-tightly closing valves so that it is ensured that the operator of the system will not come in contact with the gas-atmospheric conditions inside the reactor vessel.

The above-described reactor is suitable for the production of the most varied materials. Specifically, not only III–IV-layers can be produced but also II–VI-semiconductor layers, SiC, SiGe, oxides, superconducting materials, etc.

In this case, the process pressures may be below or above 100 mbar.

Other objects, advantages and novel features of the present invention will become apparent from the following detailed description of the invention when considered in conjunction with the accompanying drawings.

BRIEF DESCRIPTION OF THE DRAWINGS

In the following, the invention will be explained without a limitation of the general idea of the invention by means of embodiments with reference to the drawing to which explicit reference is made with respect to all inventive details of the invention not explained in the text.

DETAILED DESCRIPTION OF THE DRAWINGS

Figure 1:
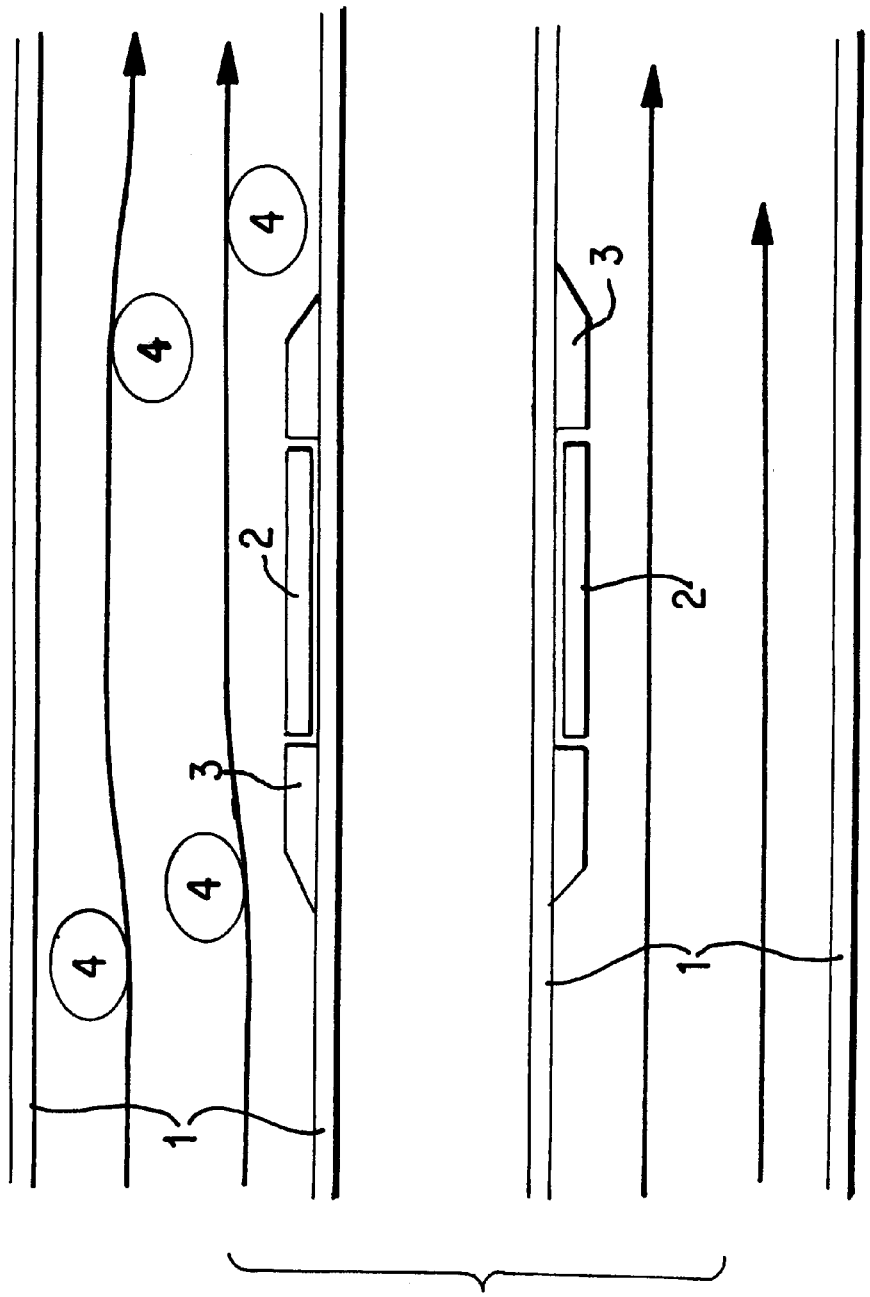
FIG. 1 is a schematic comparison of the flow conditions inside a reactor vessel.

The upper representation of FIG. 1 shows a cross-section of the reactor vessel 1 in which a reaction gas flow (see flow arrows) is situated. The substrate 2 to be coated is fastened inside a carrying ring 3 and is oriented upwards by means of its main surface to be coated. By means of convection processes, turbulent whirls 4 are formed inside the flow carrying canal which prevent a uniform coating of the substrate 2.

In contrast to the upper representation of FIG. 1, the lower representation shows that the arrangement of the substrate to be coated inside the carrying ring 3 is mounted such that the layer to be coated is oriented downward. As a result, no swirl formations can be observed. The laminar flow of the reaction gas is not disturbed as the result of convection processes so that a uniform layer depositing can take place.

According to the invention, at least two spaces for substrates are provided on the substrate holder unit. In this case, the holder or holders is/are constructed in the manner of a template which has openings for the surfaces of the substrates to be coated. Sensors for in-situ monitoring of the coating process are also provided on the substrate holder unit.

Figure 2:
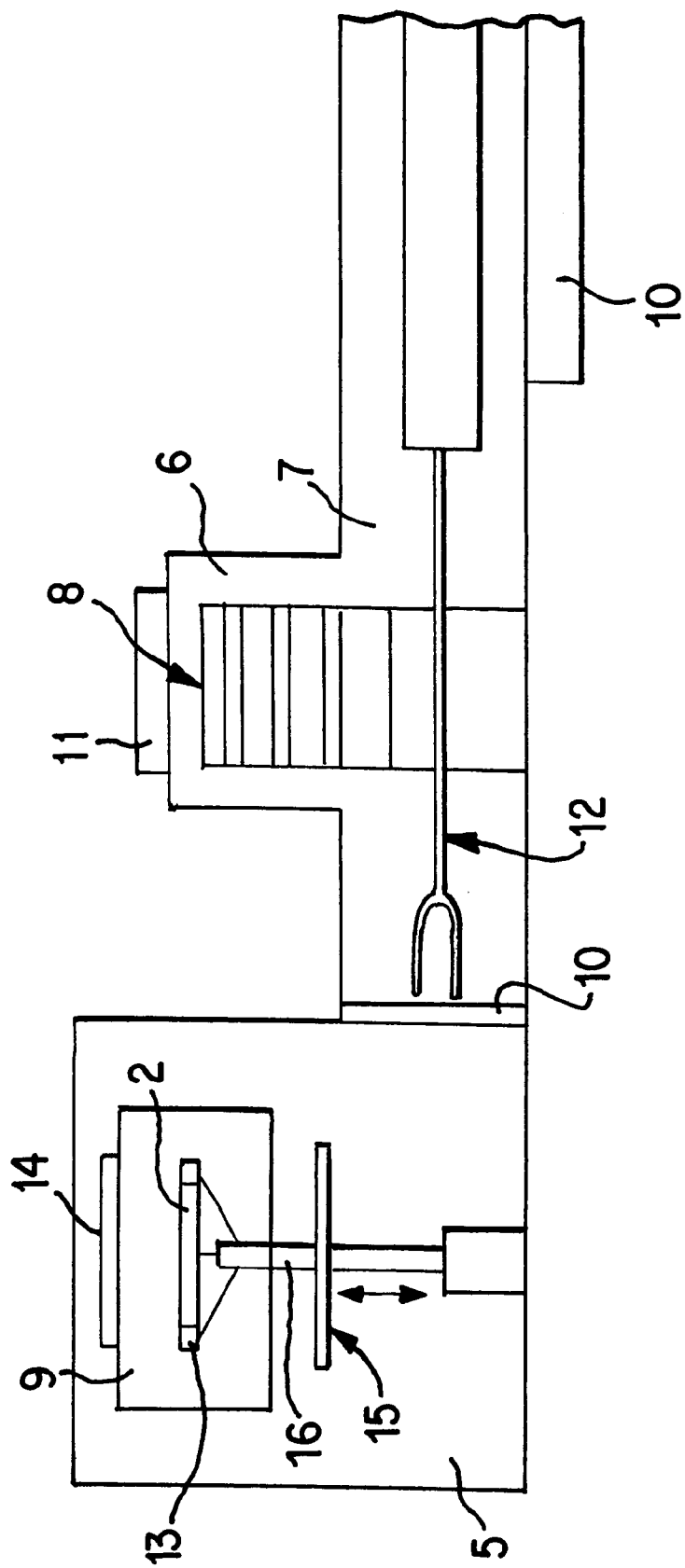
FIG. 2 is a schematic overall representation of the reactor arrangement together with the cassette housing and transfer canal housing.

FIG. 2 is a schematic representation of the complete reactor components which always have a reactor housing 5, a cassette housing 6 and a transfer canal housing 7. The flat substrate 2, which itself is framed in a carrying ring 13, after having been entered for the start of a coating operation through a transfer canal housing 7 into the cassette housing 6, is situated inside the cassette charger 8. The substrate 2 together with the carrying ring 13 is introduced by means of a valve 10, which connects the reactor housing 5 with the cassette housing 6, into the reactor housing 5 from where it is transferred into the reactor vessel 9. The transferring of the substrate 2 together with the carrying ring 13 into the reactor vessel 9 is implemented by means of a fork arm 12 which engages with the carrying ring 13 and takes the carrying ring together with the substrate out of the cassette charger 8 and moves it in a linear guide through a charge transfer canal inside the reactor housing 9. The positioning of the substrate 2 takes place such under an opening of the reactor vessel 2 that a receiving arm 16 is applied vertically from below to the carrying ring 13 by means of three fingers and moves this carrying ring 13 together with the substrate 2 vertically upward through the opening of the reactor vessel (see vertical translational arrow). The receiving arm 16, which at the same time also defines the axis of rotation of the substrate, presses the substrate by way of the carrying ring with its upper surface against a heatable graphite plate 14 provided in the upper wall section.

The three fingers of the vertical receiving arm preferably made of quartz are lead out in the downward direction in a common central axis which is at the same time the axis of rotation for the substrate. This axis is led gas-tightly but rotatably through a lower quartz plate 15 which has larger dimensions than the lower opening of the reactor vessel 9 through which the substrate 2 was introduced into the reactor vessel 9 and closes this opening gas-tightly in the downward direction.

The preferred embodiment according to FIG. 2 contains a horizontal rectangular tube reactor for 2"-, 3"- and 4"-substrates which consists of a pressure-tight and vacuum-tight housing made of forged aluminum with a flanged-on charging machine made of the same material. The flanged-on charging machine corresponds to the already described cassette housing in which the substrates to be coated are stacked within the framework of a cassette charger. After the conclusion of the charging of the substrates inside the reactor vessel, the substrates, which are fixed on a carrying ring, will start to rotate so that, in the manner described above, a uniform layer depositing will take place. After the conclusion of the coating, hydrogen is introduced into the reactor vessel at a freely selectible pressure so that the reactor, which is still at a temperature of approximately 400° C., can be opened and the exchange of substrates can be carried out. A lamp heating system and/or an RF-heating system is provided which has several heating elements which can be controlled individually or in subassemblies for improving the homogeneity of the temperature. When a cassette charger is used, the exchange of substrates takes place in approximately 8 minutes; whereas 15 minutes are required if the substrates are entered into the reactor vessel without the cassette charger. As a result of the use of the cassette charger, the coating operating can be carried out fully automatically.

In addition, according to FIG. 2, the reactor arrangement has valves 10 which provide a gas-tight connection of the illustrated housing parts. Furthermore, the cassette holder 6 can be rapidly charged with the substrates by way of a charging door 11.

The reactor according to the invention is equally suitable for research, development and production. It was found to be particularly advantageous that a charging device which has the charging ring for the substrate is at the same time part of the sealing system of the reactor vessel so that the emerging of reaction gases from the interior of the reactor to the outside can be prevented.

By means of the particularly advantageously designed translational kinematics of the substrate conveying between the individual process stations, it was possible for the first time to carry out the coating sequence in a fully automatic manner.

What is claimed is:

1. Reactor for coating flat substrates, comprising:
   a reaction vessel into which reaction gases can be introduced; and
   a substrate holder unit in the form of a carrier ring in which at least one substrate to be coated is held in at least one holder such that a main surface of the at least one substrate to be coated is oriented downward during a deposition operation and is aligned essentially in parallel to a flow direction of the reaction gases; wherein
   at least one space for a substrate is provided on the substrate holder unit;
   the at least one holder is constructed as a template which has openings for surfaces of the at least one substrate to be coated;
   a surface of the at least one holder extends at least approximately flush with a surface of the at least one substrate;

the at least one holder is adapted to be introduced into the reactor together with the at least one substrate and to be removed again from it;

the at least one holder comprises at its bottom surface three fingers leading out in a common central axis which is also an axis of rotation for the at least one substrate;

the at least one holder is adapted for introducing the at least one substrate into the reactor vessel from below, lateral to the flow direction of the reaction gases, through a lower opening of the reactor vessel;

the axis is provided gas-tightly but rotatably through a lower quartz plate which has larger dimensions than the lower opening of the reactor vessel; and the quartz plate can be gas-tightly sealed to the lower opening of the reactor in the downward direction.

2. Reactor according to claim 1, wherein a common holder is provided for at least two substrates.

3. Reactor according to claim 1, wherein a separate holder is provided for each substrate.

4. Reactor according to the preamble of claim 1, wherein the substrate holder unit(s) rotate(s) about an axis.

5. Reactor according to claim 1, further comprising a charging device which introduces the holder and at least one substrates carried thereby into the reactor and removes them again.

6. Reactor according to claim 5, wherein a cassette storage device is provided from which the charging device removes the holders together with the substrates so that a fully automatic stacking operation can be carried out.

7. Reactor according to claim 1, wherein the reactor is a horizontal rectangular tube reactor.

8. Reactor according to claim 1, wherein the reactor has a pressure-tight and vacuum-tight housing made of forged aluminum.

9. Reactor according to claim 1, wherein the reactor construction materials have quartz and molybdenum and no graphite.

10. A Reactor according to claim 1, wherein the holder or holders has/have sensors for an in-situ monitoring of the coating process.

11. Reactor according to claim 1, wherein a lamp heating system and/or an RF-heating system is provided which has several heating elements which can be controlled individually or in subassemblies for improving the homogeneity of the temperature.

12. Reactor according to claim 1, wherein the holder or holders presses/press the substrates on a heatable graphite or molybdenum plate.

13. Reactor according to claim 1, wherein a receiving fork is provided for removing the substrate from a cassette storage device and moving it to a position below an opening in the reactor vessel.

14. Reactor according to claim 13, wherein a receiving arm, which has several fingers made of quartz, is applied from below to the carrying ring and lifts it vertically upward to a place in the reactor vessel.

15. Reactor according to claim 14, wherein the receiving arm at the same time represents the axis of rotation of the substrate during the coating process.

16. Reactor according to claim 1, wherein the reactor is a multi-purpose reactor which particularly is also used for the production of II–VI layers according to the MOCVD-process.

* * * * *